(12) United States Patent
Hsieh et al.

(10) Patent No.: US 6,225,648 B1
(45) Date of Patent: May 1, 2001

(54) HIGH-BRIGHTNESS LIGHT EMITTING DIODE

(75) Inventors: Min-Hsun Hsieh, Hsinchu; Ming-Jiunn Jou, Hsinchu Hsien; Biing-Jye Lee, Hsinchu, all of (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 09/352,498

(22) Filed: Jul. 9, 1999

(51) Int. Cl.$^7$ ........................................... H01L 33/00
(52) U.S. Cl. .................................. 257/95; 257/99
(58) Field of Search .................. 257/94, 95, 99

(56) References Cited

U.S. PATENT DOCUMENTS

| | | | |
|---|---|---|---|
| 5,861,636 | * | 1/1999 | Dutta et al. ........................ 257/91 |
| 6,040,590 | * | 3/2000 | OBrien et al. ..................... 257/94 |

\* cited by examiner

*Primary Examiner*—Olik Chaudhuri
*Assistant Examiner*—Douglas A. Wille
(74) *Attorney, Agent, or Firm*—Winston Hsu

(57) ABSTRACT

A high-brightness light emitting diode is provided. It comprises a first electrode; a semiconductor substrate formed on the first electrode; a first cladding layer of a first conductivity type formed on the semiconductor substrate; an active layer formed on the first cladding layer; a second cladding layer of a second conductivity type formed on the active layer; a window layer of the second conductivity type formed on the second cladding layer and having an upper surface and a bottom surface, wherein a groove of a predetermined shape is formed at a predetermined location and substantially extends from the upper surface to the bottom surface so that the window layer is substantially separated into a first window portion and a second window portion and the current in the first window portion substantially cannot flow into the second window portion; a contact layer formed on the first window portion; a transparent conductive layer consisting of a first conductive portion and a second conductive portion, wherein the first conductive portion is formed on the contact layer and an ohmic contact is formed between the first conductive portion and the contact layer, the second conductive portion contacts with the surface of the groove and the upper surface of the second window portion, and a Schottky barrier is formed between the conductive portion and the window layer; and a second electrode formed on the conductive layer at a location over the second window portion.

14 Claims, 5 Drawing Sheets

HIGH-BRIGHTNESS LIGHT EMITTING DIODE

FIELD OF THE INVENTION

The present invention relates generally to light emitting diodes (LEDs), and more particularly to high-brightness LEDs.

BACKGROUND OF THE INVENTION

In U.S. Pat. No. 5,789,768 issued to Biing-Jye Lee et al., and assigned to the same assignee as the present application, a structure, as shown in FIG. 1, of a light emitting diode (LED) having high brightness is disclosed. In this structure, a semiconductor substrate 12 of n-type GaAs is formed on an n-type back electrode 10, and a distributed Bragg reflector (DBR) layer 30 is formed on the semiconductor substrate 12. AlGaInP or AlGaAs is preferably used in forming this DBR layer 30. A stacked structure 14 is formed on the DBR layer 30. The stacked structure 14 includes a bottom n-type cladding layer of AlGaInP 140, an active layer of AlGaInP 142, and a top p-type cladding layer of AlGaInP 144. A p-type window layer 16 is formed on the top cladding layer 144. Transparent material, such as GaP, GaAsP, GaInP or AlGaAs is preferably used to form the window layer 16. A p-type contact layer 17 is formed on the window layer 16. GaAsP, GaP, GaInP, or GaAs is preferably used to form the contact layer 17. A transparent conductive layer 19 is formed on the contact layer 17, extends into the central through hole of the contact layer 17, and contacts with the window layer 16. Tin oxide, indium oxide, or indium tin oxide (ITO) is preferably used to form the conductive layer 19. A p-type front electrode 20 is formed on the conductive layer 19.

This prior light emitting diode is characterized in that an ohmic contact is formed between the conductive layer 19 and the contact layer 16, and the interface between the conductive layer 19 and the window layer 17 results in a Shottky barrier. Therefore, the current from the front electrode 20 spreads out in the conductive layer 19, passes through the ohmic contact without passing through the Shottky barrier, and flows into the active layer 142 wherein it meets the current from the back electrode 10 and achieve the light emitting effect.

Although the current from the front electrode can be controlled to pass through the ohmic contact without passing through the Shottky barrier in this prior light emitting diode, part of the current will flow toward the location directly below the front electrode 20 when passing through the window layer 16. This part of the current flows into the active layer 142 at the location directly below the electrode 20, meets the current from the back electrode 10 there, and thereby results in light emitting effect. All of those who are skilled in the art know that the light emitted from the active layer at the location directly below the electrode 20 will be blocked by the electrode 20 and this will result in a low light emitting efficiency.

In the construction of the second embodiment disclosed in U.S. Pat. No. 5,153,889 issued to Hideto Sugawara et al., a current inhibiting layer is provided between a window layer and an upper clad layer to control the current distribution. However, the disadvantage of this prior light emitting diode lies in that it has to be formed in two epitaxial processes. More specifically, after forming the current inhibiting layer on the upper clad layer, the undesired portion of the current inhibiting layer has to be removed. After this, the second epitaxial process for forming the window layer can be carried out. The costs of equipment, manufacturing time, and yielding good products incurred by two epitaxial processes are much higher than those by a single epitaxial process.

SUMMARY OF THE INVENTION

To avoid the aforementioned disadvantages, it is an object of the invention to provide a high-brightness light emitting diode in which the current distribution in the active layer is under adequate control so that a better light emitting efficiency than the prior art can be achieved.

Another object of the present invention is to provide a high-brightness light emitting diode that only requires a single epitaxial process.

To achieve the above and other objects, a high-brightness light emitting diode is provided. It comprises a first electrode; a semiconductor substrate formed on the first electrode; a first cladding layer of a first conductivity type formed on the semiconductor substrate; an active layer formed on the first cladding layer; a second cladding layer of a second conductivity type formed on the active layer; a window layer of the second conductivity type formed on the second cladding layer and having an upper surface and a bottom surface, wherein a groove of a predetermined shape is formed at a predetermined location and substantially extends from the upper surface to the bottom surface so that the window layer is substantially separated into a first window portion and a second window portion and the current in the first window portion substantially cannot flow into the second window portion; a contact layer formed on the first window portion; a transparent conductive layer consisting of a first conductive portion and a second conductive portion, wherein the first conductive portion is formed on the contact layer and an ohmic contact is formed between the first conductive portion and the contact layer, the second conductive portion contacts with the surface of the groove and the upper surface of the second window portion, and a Schottky barrier is formed between the conductive portion and the window layer; and a second electrode formed on the conductive layer at a location over the second window portion.

BRIEF DESCRIPTION OF THE DRAWINGS

The above and other objects and the features and effects of the invention can be best understood by referring to the following detailed description of the preferred embodiment and the accompanying drawings, wherein.

DETAILED DESCRIPTION OF THE PREFERRED EMBODIMENTS

Figure 1:
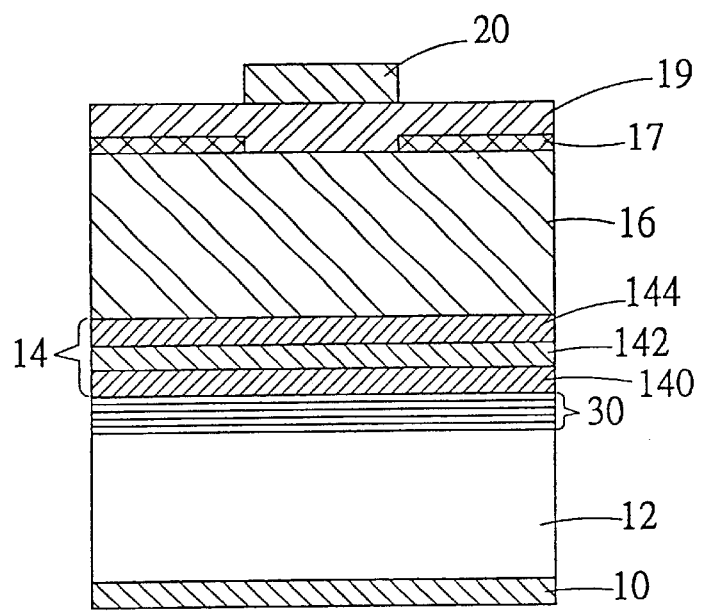
FIG. 1 is a cross-sectional view schematically showing a prior art light emitting diode.
Figure 2:
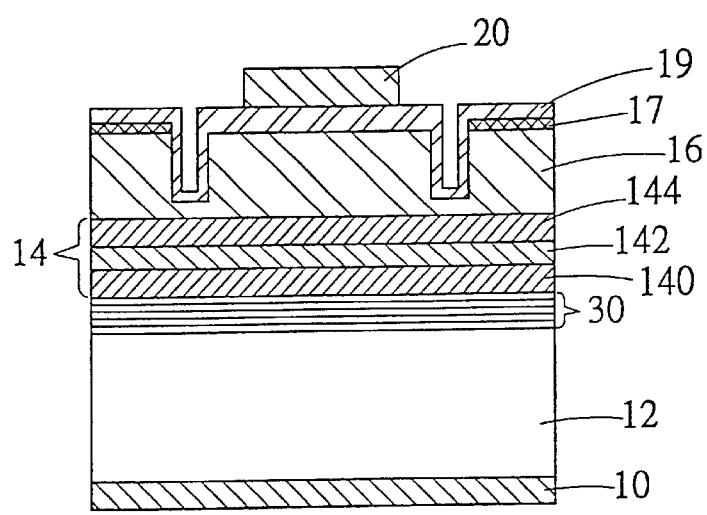
FIG. 2 is a cross-sectional view schematically showing the light emitting diode in accordance with the first preferred embodiment of the invention.

FIG. 2 schematically shows the first embodiment of the light emitting diode in accordance with the invention, wherein an n-GaAs semiconductor substrate 12 is formed on an n-type electrode 10. A distributed Bragg reflector layer 30 is formed on the semiconductor substrate 12. The distributed Bragg reflector layer 30 comprises a material chosen from the group consisting of AlGaInP and AlGaAs. A stacked structure 14 is formed on the reflector layer 30. The stacked structure 14 includes a bottom n-type cladding layer of AlGaInP 140, an active layer of AlGaInP 142, and a top p-type cladding layer of AlGaInP 144. A p-type window layer 16 is formed on the top cladding layer 144. The window layer 16 preferably comprises a transparent material chosen from the group consisting of GaP, GaAsP, GaInP, AlGaInP, and AlGaAs. A circular groove of a predetermined depth is formed by dry etching or wet etching in the window layer 16 at a predetermined distance from the location directly below the front electrode 20 (to be described in the following). A p-type contact layer 17 is formed on the window layer 16 at a suitable distance from the location directly below the front electrode 20 (to be described in the following). The contact layer 17 preferably comprises a transparent material chosen from the group consisting of GaP, GaAsP, GaInP, and GaAs. The outer portion of a transparent conductive layer 19 is formed on the contact layer 17 and forms an ohmic contact with the contact layer 17. The other portion of the conductive layer 19 contacts with the window layer 16 directly and a Schottky barrier is formed between the conductive layer 19 and the window layer 16. The conductive layer 19 preferably comprises a transparent material chosen from the group consisting of indium tin oxide, indium oxide, tin oxide, zinc oxide, and magnesium oxide.

Due to that an ohmic contact is formed between the conductive layer 19 and the contact layer 17, a Schottky barrier is formed between the conductive layer 19 and the window layer 16, and the circular groove is provided in the window layer 16, the current from the front electrode 20, after being distributed in the conductive layer 19, only flows through the ohmic contact without flowing through the Schottky barrier. Thereby, the chance that the current flowing through the ohmic contact diffuses into the location directly under the front electrode 20 can be significantly reduced so that substantially all the current that is sent from the front electrode 20 and has flowed into the active layer 142 achieves light emitting effect at a proper distance from the location directly under the front electrode 20. Therefore, the light blocking effect by the front electrode 20 can be avoided and improved efficacy of light emitting from the diode can be achieved.

The light emitting diode in accordance with the first embodiment of the invention only requires a single epitaxial process. Compared with using the construction of the second embodiment disclosed in U.S. Pat. No. 5,153,889, the costs of equipment, manufacturing time, and yielding good products can obviously be reduced by using the first embodiment of the invention.

Figure 3:
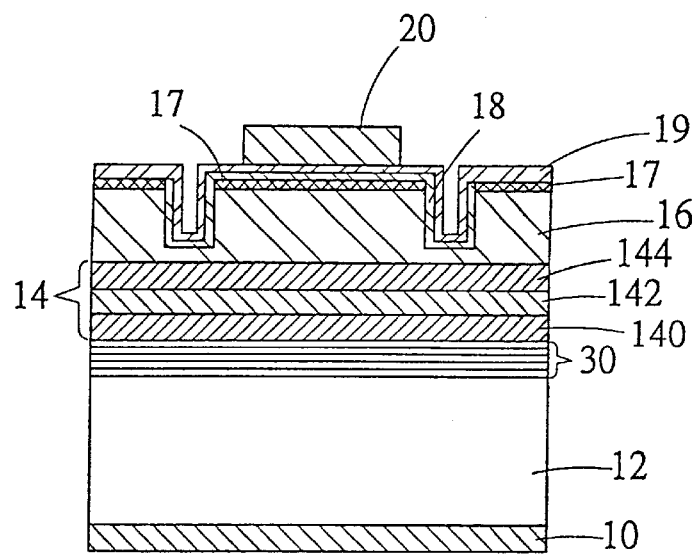
FIG. 3 is a cross-sectional view schematically showing the light emitting diode in accordance with the second preferred embodiment of the invention.

The light emitting diode in accordance with the second embodiment of the invention as shown in FIG. 3 differs from the first embodiment in that: an insulating layer 18 is provided and the portion of the contact layer 17 directly under the front electrode needs not to be removed. In the case that the Schottky barrier in the first embodiment of the invention cannot withstand the voltage drop between the front electrode 20 and the back electrode 10, the insulating layer 18 of suitable thickness is necessary to control the current distribution in accordance with the invention and to achieve the object of better light emitting efficiency. The insulating layer comprises a material chosen from the group consisting of silicon oxide, silicon nitride, and aluminum oxide.

Figure 4:
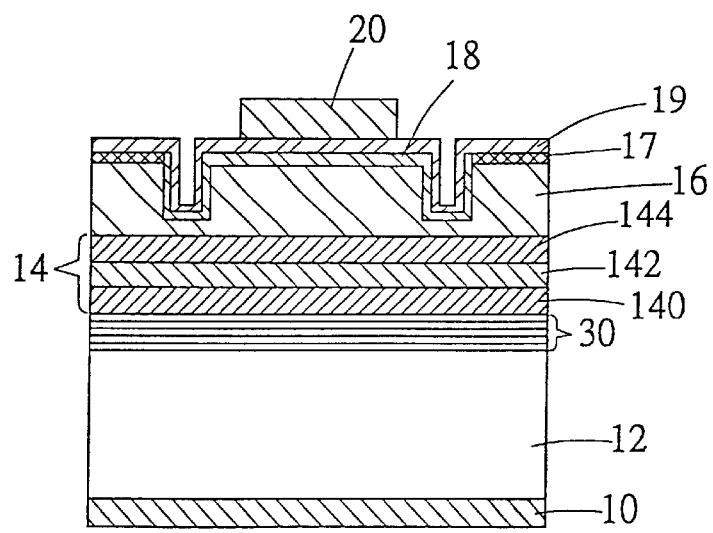
FIG. 4 is a cross-sectional view schematically showing the light emitting diode in accordance with the third preferred embodiment of the invention.

The light emitting diode in accordance with the third embodiment of the invention as shown in FIG. 4 differs from the first embodiment in that: an insulating layer 18 is provided at the location corresponding to where the Schottky barrier is formed in the first embodiment. In the case that the Schottky barrier in the first embodiment of the invention cannot withstand the voltage drop between the front electrode 20 and the back electrode 10, the insulating layer 18 of suitable thickness is necessary to control the current distribution in accordance with the invention and to achieve the object of better light emitting efficiency.

Figure 5:
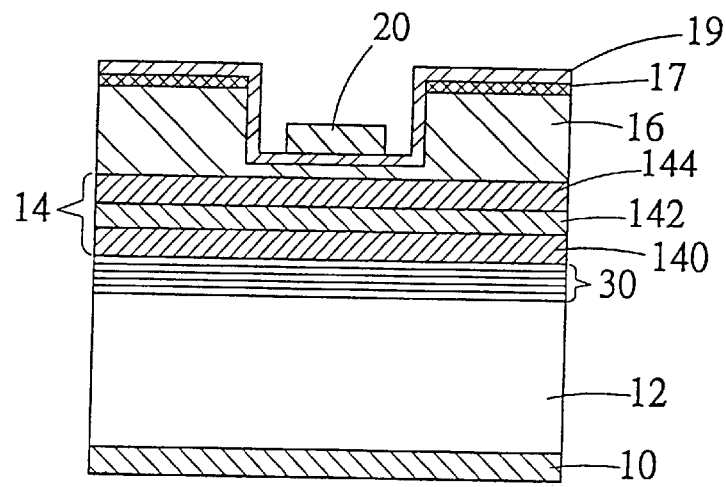
FIG. 5 is a cross-sectional view schematically showing the light emitting diode in accordance with the fourth preferred embodiment of the invention.

The light emitting diode in accordance with the fourth embodiment of the invention as shown in FIG. 5 differs from the first embodiment in that: after forming the contact layer 17 on the window layer 16, a cylindrical concavity substantially extending to the bottom of the window layer 16 is formed in the central portion of the window layer 16. The conductive layer 19 is formed on the contact layer 17 and the bottom and side surfaces of the concavity. The front electrode 20 is formed on the conductive layer 19 at the central location of the concavity.

Due to that an ohmic contact is formed between the conductive layer 19 and the contact layer 17 and a Schottky barrier is formed between the conductive layer 19 and the window layer 16, the current from the front electrode 20, after being distributed in the conductive layer 19, only flows through the ohmic contact without flowing through the Schottky barrier. Thereby, the chance that the current flowing through the ohmic contact diffuses into the location directly under the front electrode 20 can be significantly reduced so that substantially all the current that is sent from the front electrode 20 and has flowed into the active layer 142 achieves light emitting effect at a proper distance from the location directly under the front electrode 20. Therefore, the light blocking effect by the front electrode 20 can be avoided and improved efficacy of light emitting from the diode can be achieved.

Figure 6:
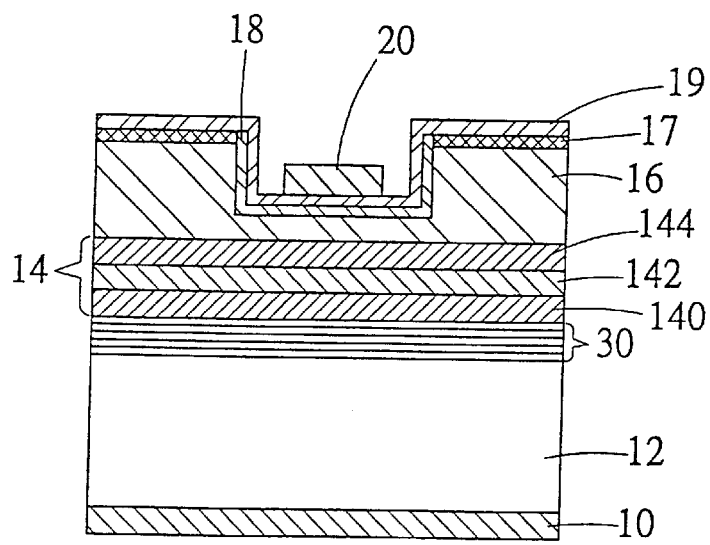
FIG. 6 is a cross-sectional view schematically showing the light emitting diode in accordance with the fifth preferred embodiment of the invention.

The light emitting diode in accordance with the fifth embodiment of the invention as shown in FIG. 6 differs from the fourth embodiment in that: an insulating layer 18 is provided at the location corresponding to where the Schottky barrier is formed in the fourth embodiment. In the case that the Schottky barrier in the fourth embodiment of the invention cannot withstand the voltage drop between the front electrode 20 and the back electrode 10, the insulating layer 18 of suitable thickness is necessary to control the current distribution in accordance with the invention and to achieve the object of better light emitting efficiency.

Figure 7:
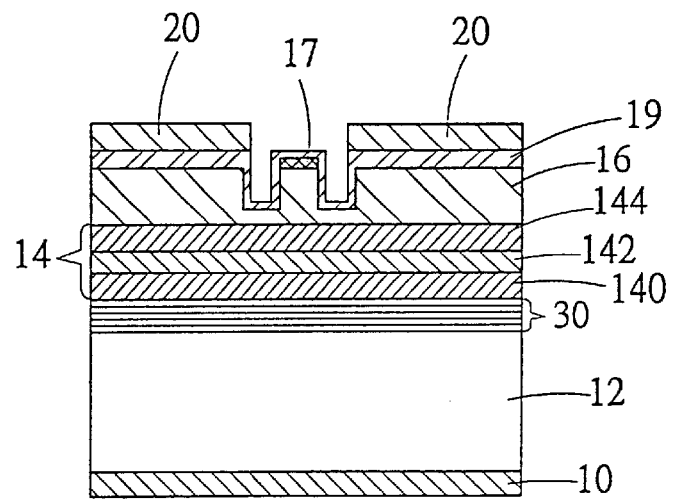
FIG. 7 is a cross-sectional view schematically showing the light emitting diode in accordance with the sixth preferred embodiment of the invention.

The light emitting diode in accordance with the sixth embodiment of the invention as shown in FIG. 7 differs from the first embodiment in that: the front electrode is formed on the outer circumferential portion of the conductive layer 19 and the contact layer 17 is formed on the window layer 16 at the central location of the light emitting diode. Therefore, the light can be emitted from the central portion of the diode. This structure is suitable for use in transmitting the light into a light fiber.

Figure 8:
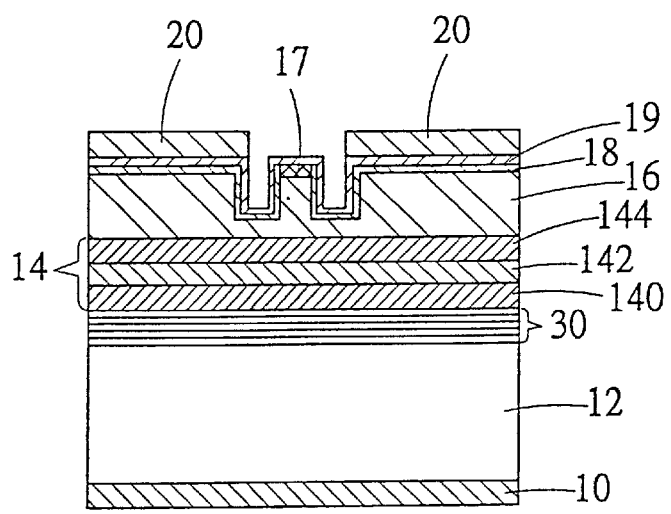
FIG. 8 is a cross-sectional view schematically showing the light emitting diode in accordance with the seventh preferred embodiment of the invention.

The light emitting diode in accordance with the seventh embodiment of the invention as shown in FIG. 8 differs from the sixth embodiment in that: an insulating layer 18 is provided at the location corresponding to where the Schottky barrier is formed in the sixth embodiment. In the case that the Schottky barrier between the conductive layer 19 and the window layer 16 in the sixth embodiment of the invention cannot withstand the voltage drop between the front electrode 20 and the back electrode 10, the insulating layer 18 of suitable thickness is necessary to control the current distribution in accordance with the invention and to achieve the object of better light emitting efficiency.

Figure 9:
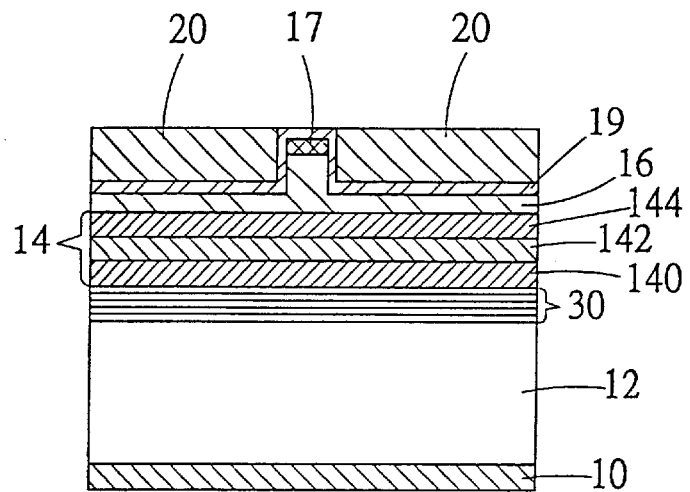
FIG. 9 is a cross-sectional view schematically showing the light emitting diode in accordance with the eighth preferred embodiment of the invention.

The light emitting diode in accordance with the eighth embodiment of the invention as shown in FIG. 9 differs from the seventh embodiment in that: after the window layer 16 of suitable thickness is formed on the top cladding layer 144, only the central portion of the window layer 16 is kept intact and the outer portion beside the central portion is removed by dry etching or wet etching so that a lower surface and a central cylindrical projection are formed.

Figure 10:
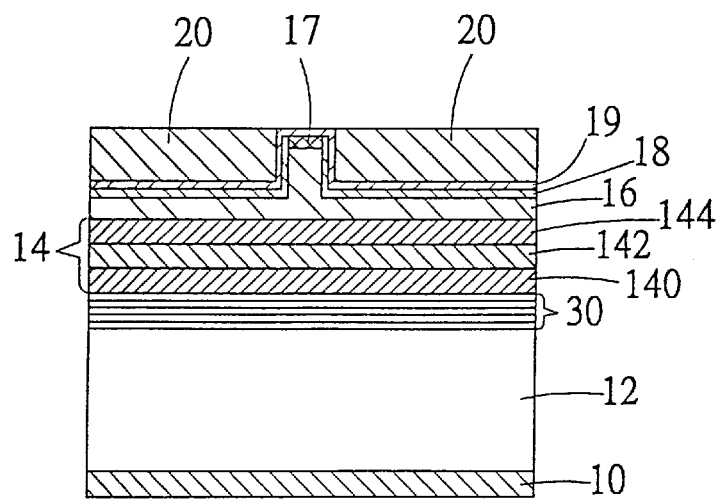
FIG. 10 is a cross-sectional view schematically showing the light emitting diode in accordance with the ninth preferred embodiment of the invention.

The light emitting diode in accordance with the ninth embodiment of the invention as shown in FIG. 10 differs from the eighth embodiment in that: an insulating layer 18 is provided at the location corresponding to where the Schottky barrier is formed in the eighth embodiment. In the case that the Schottky barrier between the conductive layer 19 and the window layer 16 in the eighth embodiment of the invention cannot withstand the voltage drop between the front electrode 20 and the back electrode 10, the insulating layer 18 of suitable thickness is necessary to control the current distribution in accordance with the invention and to achieve the object of better light emitting efficiency.

Although the preferred embodiments of the invention has been illustrated and described, it will be obvious to those skilled in the art that various modifications may be made without departing from the scope and spirit of the invention defined by the appended claims. For example, the distributed Bragg reflector (DBR) layer 30 can be removed. For another example, a circular insulating portion can be formed in the window layer 16 by ion implantation to replace the circular groove in accordance with the invention. Obviously, both of these examples cannot escape the scope and spirit of the invention.

What is claimed is:

1. A high-brightness light emitting diode comprising:
a first electrode;
a semiconductor substrate formed on said first electrode;
a first cladding layer of a first conductivity type formed on said semiconductor substrate;
an active layer formed on said first cladding layer;
a second cladding layer of a second conductivity type formed on said active layer;
a window layer of the second conductivity type formed on said second cladding layer and having an upper surface and a bottom surface, wherein a predeterminedly-shaped groove is formed at a predetermined location and substantially extends from said upper surface to said bottom surface so that said window layer is substantially separated into a first window portion and a second window portion and the current in said first window portion substantially cannot flow into said second window portion;
a contact layer formed on said first window portion;
a transparent conductive layer consisting of a first conductive portion and a second conductive portion, wherein said first conductive portion is formed on said contact layer and an ohmic contact is formed between said first conductive portion and said contact layer, said second conductive portion contacts with the surface of said groove and the upper surface of said second window portion, and a Schottky barrier is formed between said second conductive portion and said window layer; and
a second electrode formed on said conductive layer at a location over said second window portion.

2. The high-brightness light emitting diode according to claim 1, further comprising a distributed Bragg reflector layer having a plurality of sublayers formed on said substrate and under said first cladding layer, wherein said substrate comprises GaAs, said distributed Bragg reflector layer comprises a material chosen from the group consisting of AlGaInP and AlGaAs, said first cladding layer comprises AlGaInP, said active layer comprises AlGaInP, said second cladding layer comprises AlGaInP, said window layer comprises a material chosen from the group consisting of GaP, GaAsP, GaInP, AlGaInP, and AlGaAs, said contact layer comprises a material chosen from the group consisting of GaAsP, Gap, GaInP, and GaAs, said transparent conductive layer comprises a material chosen from the group consisting of indium tin oxide, indium oxide, tin oxide, zinc oxide, and magnesium oxide, said predeterminedly-shaped groove is a circular groove, and the circular groove encloses said second window portion.

3. A high-brightness light emitting diode comprising:
a first electrode;
a semiconductor substrate formed on said first electrode;
a first cladding layer of a first conductivity type formed on said semiconductor substrate;
an active layer formed on said first cladding layer;
a second cladding layer of a second conductivity type formed on said active layer;
a window layer of the second conductivity type formed on said second cladding layer and having an upper surface and a bottom surface, wherein a predeterminedly-shaped groove is formed at a predetermined location and substantially extends from said upper surface to said bottom surface so that said window layer is substantially separated into a first window portion and a second window portion and the current in said first window portion substantially cannot flow into said second window portion;
a contact layer consisting of a first contact portion and a second contact portion, wherein said first contact portion is formed on said first window portion and said second contact portion is formed on said second window portion;
an insulating layer consisting of a first insulating portion formed on the surface of said groove and a second insulating portion formed on said second contact portion;
a transparent conductive layer formed on said first contact portion, the first insulating portion of said insulating layer, and the second insulating portion of said insulating layer, the transparent conductive layer forming an ohmic contact with said first contact portion; and a second electrode formed on said conductive layer at a location over said second window portion.

4. The high-brightness light emitting diode according to claim 3, further comprising a distributed Bragg reflector layer having a plurality of sublayers formed on said substrate and under said first cladding layer, wherein said substrate comprises GaAs, said distributed Bragg reflector layer comprises a material chosen from the group consisting of AlGaInP and AlGaAs, said first cladding layer comprises AlGaInP, said active layer comprises AlGaInP, said second cladding layer comprises AlGaInP, said window layer comprises a material chosen from the group consisting of GaP, GaAsP, GaInP, AlGaInP, and AlGaAs, said contact layer comprises a material chosen from the group consisting of GaAsP, Gap, GaInP, and GaAs, said insulating layer comprises a material chosen from the group consisting of silicon oxide, silicon nitride, and aluminum oxide, said transparent conductive layer comprises a material chosen from the group consisting of indium tin oxide, indium oxide, tin oxide, zinc oxide, and magnesium oxide, said predeterminedly-shaped groove is a circular groove, and the circular groove encloses said second window portion.

5. A high-brightness light emitting diode comprising:

a first electrode;

a semiconductor substrate formed on said first electrode;

a first cladding layer of a first conductivity type formed on said semiconductor substrate;

an active layer formed on said first cladding layer;

a second cladding layer of a second conductivity type formed on said active layer;

a window layer of the second conductivity type formed on said second cladding layer and having an upper surface and a bottom surface, wherein a predeterminedly-shaped groove is formed at a predetermined location and substantially extends from said upper surface to said bottom surface so that said window layer is substantially separated into a first window portion and a second window portion and the current in said first window portion substantially cannot flow into said second window portion;

a contact layer formed on said first window portion;

an insulating layer consisting of a first insulating portion formed on the surface of said groove and a second insulating portion formed on said second window portion;

a transparent conductive layer formed on said contact layer, the first insulating portion of said insulating layer, and the second insulating portion of said insulating layer, the transparent conductive layer forming an ohmic contact with said contact layer; and a second electrode formed on said conductive layer at a location over said second window portion.

6. The high-brightness light emitting diode according to claim 5, further comprising a distributed Bragg reflector layer having a plurality of sublayers formed on said substrate and under said first cladding layer, wherein said substrate comprises GaAs, said distributed Bragg reflector layer comprises a material chosen from the group consisting of AlGaInP and AlGaAs, said first cladding layer comprises AlGaInP, said active layer comprises AlGaInP, said second cladding layer comprises AlGaInP, said window layer comprises a material chosen from the group consisting of GaP, GaAsP, GaInP, AlGaInP, and AlGaAs, said contact layer comprises a material chosen from the group consisting of GaAsP, Gap, GaInP, and GaAs, said insulating layer comprises a material chosen from the group consisting of silicon oxide, silicon nitride, and aluminum oxide, said transparent conductive layer comprises a material chosen from the group consisting of indium tin oxide, indium oxide, tin oxide, zinc oxide, and magnesium oxide, said predeterminedly shaped groove is a circular groove, and the circular groove encloses said second window portion.

7. A high-brightness light emitting diode comprising:

a first electrode;

a semiconductor substrate formed on said first electrode;

a first cladding layer of a first conductivity type formed on said semiconductor substrate;

an active layer formed on said first cladding layer;

a second cladding layer of a second conductivity type formed on said active layer;

a window layer of the second conductivity type formed on said second cladding layer and having an upper surface and a bottom surface, wherein a hole of a predetermined shape is formed at the central location of the window layer and substantially extends from said upper surface to said bottom surface to form a bottom hole surface and a side wall surface;

a contact layer formed on said window layer and having a through hole formed at the central location thereof and in alignment with said hole in said window layer;

a transparent conductive layer formed on said contact layer, said side wall surface, and said bottom hole surface to form an ohmic contact with said contact layer; and a second electrode formed on said conductive layer at a central location of said hole.

8. The high-brightness light emitting diode according to claim 7, further comprising a distributed Bragg reflector layer having a plurality of sublayers formed on said substrate and under said first cladding layer, wherein said substrate comprises GaAs, said distributed Bragg reflector layer comprises a material chosen from the group consisting of AlGaInP and AlGaAs, said first cladding layer comprises AlGaInP, said active layer comprises AlGaInP, said second cladding layer comprises AlGaInP, said window layer comprises a material chosen from the group consisting of GaP, GaAsP, GaInP, AlGaInP, and AlGaAs, said contact layer comprises a material chosen from the group consisting of GaAsP, Gap, GaInP, and GaAs, said insulating layer comprises a material chosen from the group consisting of silicon oxide, silicon nitride, and aluminum oxide, said transparent conductive layer comprises a material chosen from the group consisting of indium tin oxide, indium oxide, tin oxide, zinc oxide, and magnesium oxide, and said predetermined shape is circular.

9. A high-brightness light emitting diode comprising:

a first electrode;

a semiconductor substrate formed on said first electrode;

a first cladding layer of a first conductivity type formed on said semiconductor substrate;

an active layer formed on said first cladding layer;

a second cladding layer of a second conductivity type formed on said active layer;

a window layer of the second conductivity type formed on said second cladding layer and having an upper surface and a bottom surface, wherein a hole of a predetermined shape is formed at the central location of the window layer and substantially extends from said upper surface to said bottom surface to form a bottom hole surface and a side wall surface;

a contact layer formed on said window layer and having a through hole formed at the central location thereof and in alignment with said hole in said window layer;

an insulating layer formed on said bottom hole surface and said side wall surface;

a transparent conductive layer formed on said contact layer and said insulating layer to form an ohmic contact with said contact layer; and a second electrode formed on said conductive layer at a central location of said hole.

10. The high-brightness light emitting diode according to claim 9, further comprising a distributed Bragg reflector layer having a plurality of sublayers formed on said substrate and under said first cladding layer, wherein said substrate comprises GaAs, said distributed Bragg reflector layer comprises a material chosen from the group consisting of AlGaInP and AlGaAs, said first cladding layer comprises AlGaInP, said active layer comprises AlGaInP, said second cladding layer comprises AlGaInP, said window layer comprises a material chosen from the group consisting of GaP, GaAsP, GaInP, AlGaInP, and AlGaAs, said contact layer comprises a material chosen from the group consisting of GaAsP, Gap, GaInP, and GaAs, said insulating layer comprises a material chosen from the group consisting of silicon oxide, silicon nitride, and aluminum oxide, said transparent conductive layer comprises a material chosen from the group consisting of indium tin oxide, indium oxide, tin oxide, zinc oxide, and magnesium oxide, and said predetermined shape is circular.

11. A high-brightness light emitting diode comprising:

a first electrode;

a semiconductor substrate formed on said first electrode;

a first cladding layer of a first conductivity type formed on said semiconductor substrate;

an active layer formed on said first cladding layer;

a second cladding layer of a second conductivity type formed on said active layer;

a window layer of the second conductivity type formed on said second cladding layer and having a lower surface, wherein a projection of a predetermined shape is formed at the central location of the window layer and said projection has an upper surface and a side surface;

a contact layer formed on said upper surface of said projection;

a transparent conductive layer formed on said lower surface of said window layer, said side surface of said projection, and said contact layer to form an ohmic contact with said contact layer; and a second electrode formed on said conductive layer over said lower surface of said window layer.

12. The high-brightness light emitting diode according to claim 11, further comprising a distributed Bragg reflector layer having a plurality of sublayers formed on said substrate and under said first cladding layer, wherein said substrate comprises GaAs, said distributed Bragg reflector layer comprises a material chosen from the group consisting of AlGaInP and AlGaAs, said first cladding layer comprises AlGaInP, said active layer comprises AlGaInP, said second cladding layer comprises AlGaInP, said window layer comprises a material chosen from the group consisting of GaP, GaAsP, GaInP, AlGaInP, and AlGaAs, said contact layer comprises a material chosen from the group consisting of GaAsP, Gap, GaInP, and GaAs, said transparent conductive layer comprises a material chosen from the group consisting of indium tin oxide, indium oxide, tin oxide, zinc oxide, and magnesium oxide, and said predetermined shape is circular.

13. A high-brightness light emitting diode comprising:

a first electrode;

a semiconductor substrate formed on said first electrode;

a first cladding layer of a first conductivity type formed on said semiconductor substrate;

an active layer formed on said first cladding layer;

a second cladding layer of a second conductivity type formed on said active layer;

a window layer of the second conductivity type formed on said second cladding layer and having a lower surface, wherein a projection of a predetermined shape is formed at the central location of the window layer and said projection has an upper surface and a side surface;

a contact layer formed on said upper surface of said projection;

an insulating layer formed on said lower surface of said window layer and said side surface of said projection;

a transparent conductive layer formed on said contact layer and said insulating layer to form an ohmic contact with said contact layer; and a second electrode formed on said conductive layer over said lower surface of said window layer.

14. The high-brightness light emitting diode according to claim 13, further comprising a distributed Bragg reflector layer having a plurality of sublayers formed on said substrate and under said first cladding layer, wherein said substrate comprises GaAs, said distributed Bragg reflector layer comprises a material chosen from the group consisting of AlGaInP and AlGaAs, said first cladding layer comprises AlGaInP, said active layer comprises AlGaInP, said second cladding layer comprises AlGaInP, said window layer comprises a material chosen from the group consisting of GaP, GaAsP, GaInP, AlGaInP, and AlGaAs, said contact layer comprises a material chosen from the group consisting of GaAsP, Gap, GaInP, and GaAs, said insulating layer comprises a material chosen from the group consisting of silicon oxide, silicon nitride, and aluminum oxide, said transparent conductive layer comprises a material chosen from the group consisting of indium tin oxide, indium oxide, tin oxide, zinc oxide, and magnesium oxide, and said predetermined shape is circular.

* * * * *